United States Patent
Strock

(10) Patent No.: US 10,322,976 B2
(45) Date of Patent: Jun. 18, 2019

(54) CALCIUM-MAGNESIUM ALUMINO-SILICATE (CMAS) RESISTANT THERMAL BARRIER COATINGS, SYSTEMS, AND METHODS OF PRODUCTION THEREOF

(71) Applicant: United Technologies Corporation, Farmington, CT (US)

(72) Inventor: Christopher W. Strock, Kennebunk, ME (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 399 days.

(21) Appl. No.: 15/101,976

(22) PCT Filed: Nov. 14, 2014

(86) PCT No.: PCT/US2014/065690
§ 371 (c)(1),
(2) Date: Jun. 6, 2016

(87) PCT Pub. No.: WO2015/116300
PCT Pub. Date: Aug. 6, 2015

(65) Prior Publication Data
US 2016/0347671 A1 Dec. 1, 2016

Related U.S. Application Data

(60) Provisional application No. 61/913,054, filed on Dec. 6, 2013.

(51) Int. Cl.
*C23C 4/04* (2006.01)
*C23C 4/11* (2016.01)
(Continued)

(52) U.S. Cl.
CPC .......... *C04B 35/62222* (2013.01); *C23C 4/04* (2013.01); *C23C 4/11* (2016.01);
(Continued)

(58) Field of Classification Search
CPC ........ F01D 11/08; F01D 9/023; F01D 25/005; F01D 5/288; C23C 14/30; C23C 4/10;
(Continued)

(56) References Cited

U.S. PATENT DOCUMENTS

2002/0172838 A1 * 11/2002 Rigney ................ C04B 35/486
428/633
2006/0210800 A1 * 9/2006 Spitsberg ............. C04B 41/009
428/408

(Continued)

FOREIGN PATENT DOCUMENTS

| EP | 1806423 A1 | 7/2007 | |
|---|---|---|---|
| EP | 3077563 A4 * | 7/2017 | ............... C23C 4/04 |
| WO | WO 2015116300 A2 * | 8/2015 | ........... C23C 14/083 |

OTHER PUBLICATIONS

European Search Report for European Application No. 14880979.1 dated Jun. 8, 2017, 8 pages.
(Continued)

*Primary Examiner* — J. Todd Newton
(74) *Attorney, Agent, or Firm* — Cantor Colburn LLP

(57) ABSTRACT

The thermal barrier coating includes reactive gadolinia in its microstructures and the embedded gadolinia effectively reacts with CMAS contaminant reducing the damage from CMAS. Moreover, a method to produce a CMAS resistant thermal barrier coating can include a post-treatment to the thermal barrier coating with the reactive gadolinia suspension in sol-gel state.

8 Claims, 2 Drawing Sheets

(51) Int. Cl.
*C23C 4/18* (2006.01)
*C04B 35/622* (2006.01)
*C23C 14/08* (2006.01)
*C23C 14/58* (2006.01)
*F01D 5/28* (2006.01)
*C23C 14/30* (2006.01)
*F01D 9/02* (2006.01)
*F01D 11/08* (2006.01)
*F01D 25/00* (2006.01)
*F23R 3/00* (2006.01)
*F23R 3/28* (2006.01)

(52) U.S. Cl.
CPC .............. *C23C 4/18* (2013.01); *C23C 14/083* (2013.01); *C23C 14/30* (2013.01); *C23C 14/5846* (2013.01); *F01D 5/288* (2013.01); *F01D 9/023* (2013.01); *F01D 11/08* (2013.01); *F01D 25/005* (2013.01); *F23R 3/002* (2013.01); *F23R 3/28* (2013.01); *F05D 2220/32* (2013.01); *F05D 2230/311* (2013.01); *F05D 2230/312* (2013.01); *F05D 2230/313* (2013.01); *F05D 2230/90* (2013.01); *F05D 2240/35* (2013.01); *F05D 2300/134* (2013.01); *F05D 2300/15* (2013.01); *F05D 2300/21* (2013.01); *F05D 2300/5023* (2013.01); *F05D 2300/6033* (2013.01)

(58) Field of Classification Search
CPC .......... C23C 4/11; C23C 14/083; C23C 4/18; C23C 14/5846; F23R 3/002; F23R 3/28; F05D 2230/312; F05D 2230/311; F05D 2240/35; F05D 300/6033; F05D 2300/5023; F05D 2230/313; F05D 2300/134; F05D 2220/32; F05D 2300/21; F05D 2300/15; F05D 2230/90
USPC .......................................................... 60/734
See application file for complete search history.

(56) References Cited

U.S. PATENT DOCUMENTS

| | | | | |
|---|---|---|---|---|
| 2007/0172703 | A1* | 7/2007 | Freling | C04B 35/50 428/702 |
| 2009/0110953 | A1* | 4/2009 | Margolies | C23C 4/18 428/621 |
| 2010/0159150 | A1* | 6/2010 | Kirby | C04B 41/009 427/452 |
| 2010/0159151 | A1* | 6/2010 | Kirby | C04B 41/009 427/452 |
| 2010/0227146 | A1* | 9/2010 | Larose | C23C 4/02 428/220 |
| 2013/0260132 | A1* | 10/2013 | Hazel | C23C 28/042 428/304.4 |
| 2014/0072836 | A1* | 3/2014 | Mills | C25B 1/04 429/8 |
| 2016/0273114 | A1* | 9/2016 | Hongoh | C23C 24/10 |

OTHER PUBLICATIONS

Notification of Transmittal of the International Search Report of the International Searching Authority, or the Declaration; PCT/US2014/065690; dated Jul. 20, 2015. 3 pages.

Notification of Transmittal of the Written Opinion of the International Searching Authority, or the Declaration; PCT/US2014/065690; dated Jul. 20, 2015. 8 pages.

* cited by examiner

FIG 2.

```
Thermal barrier coating is applied by EBPVD.
                    ↓
A slurry suspension of the gadolinia
nanoparticles are prepared.
                    ↓
The slurry suspension is painted on the surface
of the thermal barrier coating.
                    ↓
The suspension is dried and the suspension
solvent evaporates.
                Repeat
```

CALCIUM-MAGNESIUM ALUMINO-SILICATE (CMAS) RESISTANT THERMAL BARRIER COATINGS, SYSTEMS, AND METHODS OF PRODUCTION THEREOF

RELATED APPLICATIONS

This application claims the benefit of and priority to U.S. Provisional Patent Application No. 61/913,054 filed Dec. 6, 2013, the contents of which are incorporated herein by reference in their entirety.

FIELD OF THE INVENTION

The present invention relates to a calcium-magnesium alumino-silicate (CMAS) resistant thermal barrier coating, an article coated with a calcium-magnesium alumino-silicate (CMAS) resistant thermal barrier coating and a method to produce the coating thereof.

BACKGROUND OF THE INVENTION

Thermal barrier coatings (TBC) are generally applied onto metallic surfaces of, for instance, gas turbine engines or aero-space engine parts. Since such engines operate at highly elevated temperatures, the surfaces of the metallic substrates tend to thermally expand. This may cause structural defects in engines during operation and further operating failure. Thus, thermal barrier coatings are essential for those engines in order to protect the surface from thermal stress and prevent the surface damage.

However, thermal barrier coatings often fail as a result of coating buckling, peeling, detaching, or even spallation during operation. These conditions may be caused by many factors including thermal stress and environmental stress.

During the operation of such aero-space substrates, thermal barrier coatings are continuously exposed to environmental contaminants, such as a dust, sand, ash, or small debris. Among those, calcium-magnesium alumino-silicate (CMAS) contaminants cause significant damages to thermal barrier coatings. For example, at operating temperatures exceeding 1200° C., CMAS debris melts and deposits on the surface. Occasionally, such molten CMAS penetrates the thermal barrier coatings and then solidifies, ultimately causing spallation and destruction of coating.

In order to protect thermal barrier coatings from the CMAS contaminants, several methods have previously been employed. For example, an additional protective layer has been previously applied on the surface of thermal barrier coating (e.g., U.S. Pat. No. 8,470,460; US. Pub. No. 2013/0260132). Similarly, rare earth elements have previously been added to the coating components for CMAS resistance (e.g., U.S. Pat. No. 6,284,323; US. Pub. No. 2011/143043). The rare earth element gadolinium is often used in thermal barrier coatings to improve CMAS resistance. Gadolinia (gadolinium oxide, $Gd_2O_3$) is the most commonly available form of gadolinium. Gadolinia reacts with CMAS to increase the viscosity and the melting point of CMAS. As result, CMAS contaminants do not infiltrate thermal barrier coatings as deeply at the operating temperature, reducing the amount of damage caused by CMAS in thermal barrier coating.

However, high gadolinia content in thermal barrier coatings has caused reduction in durability and spallation resistance of thermal barrier coatings. In addition, raw gadolinia is an expensive material for conventional thermal barrier coatings. Thus, balance between advantageous utilization and reasonable cost is critical for producing a CMAS resistant thermal barrier coating.

The present invention addresses the economical use of gadolinia for a CMAS resistant thermal barrier coating while maximizing durability to the thermally and mechanically induced stresses.

SUMMARY OF THE INVENTION

The invention relates to a CMAS resistant thermal barrier coating (TBC), an article coated with a CMAS resistant thermal barrier coating, and a method to produce such coating thereof.

In particular, the present invention provides the method to produce a CMAS resistant thermal barrier coating without applying additional protective layers to the conventional thermal barrier coating.

In one embodiment, this invention provides a CMAS resistant thermal barrier coating comprising a thermal barrier coating layer and a reactive gadolinia. The thermal barrier coating includes microstructures, such as cracks, pores, and inter-particle boundaries. The reactive gadolinia is embedded in the microstructure, or deposited on the surface of the microstructure, or deposited on the surface of the thermal barrier coating to protect the coating from CMAS contaminants.

In certain embodiments, the thermal barrier coating layer is a ceramic coating layer comprising hafnia or fully or partially stabilized zirconia. In particular embodiments, the stabilized zirconia can include, without limitation, yttria-stabilized-zirconia (YSZ), magnesia-stabilized-zirconia, calcia-stabilized-zirconia, ceria-stabilized-zirconia, or a combination thereof. In other embodiments, the reactive gadolinia is in the form of one or more nanoparticles. The size of the gadolinia nanoparticles is not particularly limited, but may be between about 1 nm and 500 nm in diameter, between about 5 nm and 300 nm in diameter or between about 10 nm and 200 nm in diameter.

In certain embodiments, the CMAS resistant thermal barrier coating is, without limitation, between about 1 mil and 250 mil, between about 3 mil and 100 mil, or between about 5 mil and 25 mil in thickness.

This invention provides an article coated with a CMAS resistant thermal barrier coating layer, which comprises a reactive gadolinia. The article comprises a substrate, a thermal barrier coating and a reactive gadolinia, wherein the thermal barrier coating layer comprises a microstructure and the reactive gadolinia is embedded in the microstructure, or deposited on the surface of the microstructure, or deposited on the surface of the thermal barrier coating.

In certain embodiments, the thermal barrier coating layer is a ceramic coating layer comprising hafnia or fully or partially stabilized zirconia. In particular embodiments, the stabilized zirconia can include, without limitation, yttria-stabilized-zirconia (YSZ), magnesia-stabilized-zirconia, calcia-stabilized-zirconia, ceria-stabilized-zirconia, or a combination thereof.

In other embodiments, the reactive gadolinia is in the form of one or more nanoparticles. The size of the gadolinia nanoparticles is not particularly limited, but may be between about 1 nm and 500 nm in diameter, between about 5 nm and 300 nm in diameter or between about 10 nm and 200 nm in diameter.

In yet another embodiment, the thermal barrier coating is, without limitation, between about 1 mil and 250 mil, between about 3 mil and 100 mil, or between about 5 mil and 25 mil in thickness.

In still other embodiments, the article to be coated can be any article to which a thermal barrier coating is applied. In particular embodiments, the article to be coated with the CMAS resistant thermal barrier coating layer is, but is not limited to, a turbine fuel nozzle, a fuel nozzle guide, a combustion chamber liner, a transition duct, a blade, a vane or a blade outer air seal.

The present invention provides a method to produce a CMAS resistant thermal barrier coating. The method comprises steps of:

a) applying a thermal barrier coating layer on a substrate;

b) preparing a reactive gadolinia suspension; and c) treating the thermal barrier coating layer with the reactive gadolinia suspension, wherein the thermal barrier coating layer comprises a microstructure and a reactive gadolinia is embedded in the microstructure.

In particular embodiments, a reactive gadolinia is embedded in the microstructure, or deposited on the surface of the microstructure, or deposited on the surface of the thermal barrier coating. In certain embodiments, the thermal barrier coating layer is a ceramic coating layer comprising hafnia or fully or partially stabilized zirconia. In particular embodiments, the stabilized zirconia can include, without limitation, yttria-stabilized-zirconia (YSZ), magnesia-stabilized-zirconia, calcia-stabilized-zirconia, ceria-stabilized-zirconia, or a combination thereof. In another embodiment, the thermal barrier coating layer is applied by, without limitation, plasma or combustion thermal spraying, suspension plasma spraying, or electron beam physical vapor deposition (EBPVD). In certain embodiments, the microstructure in the thermal barrier coating comprises a ceramic matrix with at least one of cracks, pores, and inter-particle boundaries.

In yet another embodiments, the thermal barrier coating is, without limitation, between about 1 mil and 250 mil, between about 3 mil and 100 mil, or between about 5 mil and 25 mil in thickness.

In particular embodiments, the reactive gadolinia suspension is prepared by combining the reactive gadolinia nanoparticles with a suspension solvent. In certain embodiments, the suspension solvent may be any solvent which has a viscosity of lower than 100 centipoise, lower than 50 centipoise, or lower than 20 centipoise. In particular embodiments, the suspension solvent is, but is not limited to, water, acetic acid, benzene, tetrachloromethane, pentane, ethyl ether, methyl t-butyl ether, hexane, acetone, triethylamine, acetonitrile, heptane, methyl ethyl ketone, cyclopentane, dichloromethane, n-butyl chloride, ethyl acetate, glyme, iso-octane, methyl n-propyl ketone, tetrahydrofuran, chloroform, methyl isobutyl ketone, methanol, toluene, 1,1,2-trichlorotrifluoroethane, n-butyl acetate, ethylene dichloride, chlorobenzene, methyl isoamyl ketone, xylene, n,n-dimethylformamide, trifluoroacetic acid, pyridine, cyclohexane, ethyl alcohol, o-dichlorobenzene, 1,4-dioxane, n-methylpyrrolidone, 2-methoxyethanol, dimethyl acetamide, dimethyl formamide, dimethyl sulfoxide, n-propyl alcohol, isopropyl alcohol, n-butyl alcohol, isobutyl alcohol, isopropyl myristate, petroleum ether, propylene carbonate, 1,2,4-trichlorobenzene, or a mixture thereof.

In other embodiments, the size of the gadolinia nanoparticles is not particularly limited, but may be between about 1 nm and 500 nm in diameter, between about 5 nm and 300 nm in diameter, or between about 10 nm and 200 nm in diameter. In another particular embodiment, the reactive gadolinia suspension comprises between about 1% and 90% by weight of the reactive gadolinia nanoparticles, between about 5% and 80% by weight of the reactive gadolinia nanoparticles, between about 10% and 50% by weight of the reactive gadolinia nanoparticles, or between about 10% and 25% by weight of the reactive gadolinia nanoparticles based on the weight of the suspension.

In certain embodiments, the method of treating the thermal barrier coating layer comprises dipping, painting, spraying, or pressure infiltrating with the reactive gadolinia suspension. In another embodiment, the method further comprises the step of removing the suspension solvent from the treated substrate. In other certain embodiments, the method further comprises repeating the step of treating the thermal barrier coating layer to achieve the desired content of gadolinia. In particular embodiments, the treating step is performed two, three, five, or ten times to achieve the desired content of gadolinia.

In certain other embodiments, the article which is treated according to the methods of the invention to produce the thermal barrier coating layer are further coated with an additional layer of material to provide an additional property.

In particular embodiments, the article to be coated with the CMAS resistant thermal barrier coating layer is, but is not limited to, a turbine fuel nozzle, a fuel nozzle guide, a combustion chamber liner, a transition duct, a blade, a vane or a blade outer air seal.

BRIEF DESCRIPTION OF THE DRAWINGS

The above and other features of the present invention will now be described in detail with reference to certain exemplary embodiments thereof illustrated in the accompanying drawings which are given herein below by way of illustration only, and thus are not limitative of the present invention, and wherein:

FIG. 2 shows an exemplary diagram of steps for producing a CMAS resistant thermal barrier coating.

Figure 1:
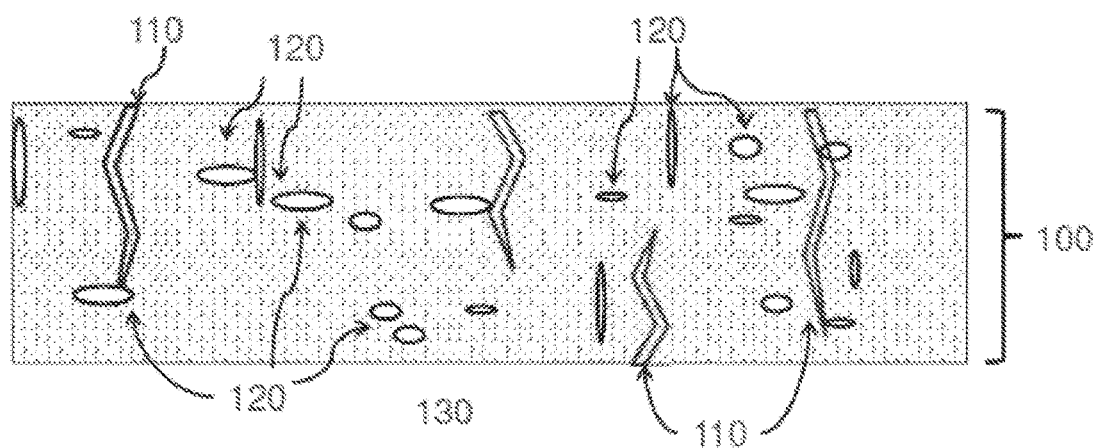
FIG. 1 is a schematic view of a CMAS resistant thermal barrier coating.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

The present invention provides a novel thermal barrier coating system which prevents damage from CMAS environmental contaminants. The TBC of the present invention comprises reactive gadolinia embedded in the microstructure, or deposited on the surface of the microstructure, or deposited on the surface of the thermal barrier coating. The reactive gadolinia in the invention is capable of reacting with CMAS contaminants further eliminating damages by CMAS contaminants.

The present invention will be more illustrated by reference to the definitions set forth below in the drawing and context of the following detailed description.

Definitions

As used herein the term "thermal barrier coating (TBC) layer" refers to a high performance coating material applied on the metallic surface of gas turbine engine components which operate at highly elevated temperature. The TBC may include a single coating layer or multiple layers. In certain embodiments, the TBC layer includes, but not is not limited to, a ceramic coating layer which comprises hafnia or fully or partially stabilized zirconia. In particular embodiments, the stabilized zirconia can include, without limitation, yttria-stabilized-zirconia (YSZ), magnesia-stabilized-zirconia, calcia-stabilized-zirconia, ceria-stabilized-zirconia, or a combination thereof. In other embodiments, the TBC layer is applied by plasma or combustion thermal spraying, suspension plasma spraying, or electron beam physical vapor deposition (EBPVD).

As used herein, "gadolinia" refers to a rare earth inorganic compound comprising gadolinium and oxygen. In certain embodiments, the gadolinia is a reactive material to react with CMAS debris. In other embodiments, the gadolinia is in the form of one or more nanoparticles.

As used herein the term "microstructure" refers to a minor vacant subunit which is introduced in a coating layer as part of the standard TBC procedure or intentionally by the process of coating application. In certain embodiments, the microstructure in the thermal barrier coating comprises a ceramic matrix with at least one of cracks, pores, and inter-particle boundaries.

CMAS Resistant Thermal Barrier Coatings

In one embodiment, this invention provides a CMAS resistant thermal barrier coating comprising a thermal barrier coating layer and a reactive gadolinia. In other embodiments, the microstructure in the thermal barrier coating comprises a ceramic matrix with at least one of cracks, pores, and inter-particle boundaries. The reactive gadolinia is embedded in the microstructure, or deposited on the surface of the microstructure, or deposited on the surface of the thermal barrier coating to protect the coating from CMAS contaminant.

The thermal barrier coating is intended to be used for controlling heat transfer and thermal stress which are transferred to the metallic base. In order to manage the heat flow efficiently, the materials for TBC may require several properties, such as insulating, matching thermal expansion coefficient or resistance to corrosion or to erosion. In such criteria, a ceramic material is a typically used for thermal barrier coating topcoat. In certain embodiments of the invention, the CMAS resistant thermal barrier coating comprises a ceramic coating layer comprising hafnia or fully or partially stabilized zirconia. In particular embodiments, the stabilized zirconia can include, without limitation, yttria-stabilized-zirconia (YSZ), magnesia-stabilized-zirconia, calcia-stabilized-zirconia, ceria-stabilized-zirconia, or a combination thereof.

In certain embodiments, the microstructure in the thermal barrier coating comprises a ceramic matrix with at least one of cracks, pores, and inter-particle boundaries. Such microstructures in the thermal barrier coating may be introduced as part of the standard thermal barrier coating procedure or intentionally by the process of coating application. For example, the ceramic coating material contains porosity which may not be avoidable during coating deposit. In another example, cracks can be introduced during the deposition, e.g., due to change of temperature. Such microstructure is a key contributor in the present invention, particularly to improve CMAS resistance of the thermal barrier coating.

In certain embodiments, the reactive gadolinia is embedded in the microstructure, or deposited on the surface of the microstructure of the thermal barrier coating. Such reactive gadolinia may infiltrate the thermal barrier coating through the microstructures, where the gadolinia reacts with penetrating CMAS contaminants. As results, such CMAS contaminants have increased viscosity and melting point further to not cause damages by precipitating in the thermal barrier coating.

FIG. 1 depicts a schematic view of a CMAS resistant thermal barrier coating of the invention. A single thermal barrier coating layer 100 is deposited on a substrate 130 with various microstructures, such as cracks 110 and pores 120. The microstructures in TBC layer embed particles of reactive gadolinia in their inner spaces. The reactive gadolinia particles can be further deposited on the surface of the microstructure, or deposited on the surface of the thermal barrier coating.

In other embodiments, the reactive gadolinia may also be deposited on the surface of the thermal barrier coating to contact with CMAS contaminant.

In other embodiments, the reactive gadolinia is in the form of one or more nanoparticles. In other embodiments, the size of the gadolinia nanoparticles is not particularly limited, but may be between about 1 nm and 500 nm in diameter, between about 5 nm and 300 nm in diameter, or between about 5 nm and 200 nm in diameter.

In yet certain embodiment, the CMAS resistant thermal barrier coating is, without limitation, between about 1 mil and 250 mil, between about 3 mil and 100 mil, or between about 5 mil and 25 mil in thickness. According to the invention, the gadolinia may infiltrate entire thermal barrier coating layer to the bottom of the layer or maybe at least a top portion from the surface. The distribution of gadolinia infiltration in thermal barrier coating layer may vary depending on total thickness of coating, condition of treating with the gadolinia suspension, content of the gadolinia suspension, size of gadolinia particle and the like. In this regard, the thickness of thermal barrier coating may be optimized to effect distribution of gadolinia, physical properties of thermal barrier coating, effectiveness for CMAS resistance, or cost of raw material of gadolinia.

Gadolinia Sol Treatment

According to the present invention, the reactive gadolinia is introduced to the microstructure of the thermal barrier coating layer by gadolinia sol treatment.

In certain embodiments, the reactive gadolinia is suspended in a solvent to make a reactive gadolinia suspension in sol state. In particular embodiments, the reactive gadolinia is in the form of one or more nanoparticles. The suspension is generally prepared by combining the reactive gadolinia nanoparticles with a suspension solvent. In certain embodiments, the suspension solvent, may be any solvent having a viscosity of lower than 100 centipoise, lower than 50 centipoise, or lower than 20 centipoise. In particular embodiments, the suspension solvent is, but is not limited to, water, acetic acid, benzene, tetrachloromethane, pentane, ethyl ether, methyl t-butyl ether, hexane, acetone, triethylamine, acetonitrile, heptane, methyl ethyl ketone, cyclopentane, dichloromethane, n-butyl chloride, ethyl acetate, glyme, iso-octane, methyl n-propyl ketone, tetrahydrofuran, chloroform, methyl isobutyl ketone, methanol, toluene, 1,1,2-trichlorotrifluoroethane, n-butyl acetate, ethylene dichloride, chlorobenzene, methyl isoamyl ketone, xylene, n,n-dimethylformamide, trifluoroacetic acid, pyridine, cyclohexane, ethyl alcohol, o-dichlorobenzene, 1,4-dioxane, n-methylpyrrolidone, 2-methoxyethanol, dimethyl acetamide, dimethyl formamide, dimethyl sulfoxide, n-propyl alcohol, isopropyl alcohol, n-butyl alcohol, isobutyl alcohol, isopropyl myristate, petroleum ether, propylene carbonate, 1,2,4-trichlorobenzene, or a mixture thereof. The sol state suspension would be understood by one of ordinary skill in the art to have dense concentration of gadolinia nanoparticle and high viscosity.

In certain embodiments, the reactive gadolinia suspension may contain between about 1% and 90% by weight of the reactive gadolinia nanoparticles, between about 5% and 80% by weight of the reactive gadolinia nanoparticles, between about 10% and 50% by weight of the reactive gadolinia nanoparticles, or between about 10% and 25% by weight of the reactive gadolinia nanoparticles based on the weight of the suspension. With respect of the gadolinia content, the suspension with the highest range of gadolinia content may be in a gel state.

According to the invention, the thermal barrier coating is treated with the gadolinia sol suspension to infiltrate the TBC with gadolinia particles. In certain embodiments, the method of infiltrating comprises dipping, painting, spraying, or pressure infiltrating with the reactive gadolinia suspension. In fact, the reactive gadolinia suspension penetrates microstructures in the thermal barrier coating by capillary action and transports the gadolinia. In other certain embodiments, the method further comprises repeating the step of treating the thermal barrier coating layer to achieve the desired content of gadolinia. The suspension solution evaporates at the end of process.

In other certain embodiments, the method further comprises repeating the step of treating the thermal barrier coating layer to achieve the desired content of gadolinia. In particular embodiments, the treating step is performed two, three, five, or ten times to achieve the desired content of gadolinia.

According to the invention, gadolinia sol treatment is an efficient technique to incorporate the reactive gadolinia to the thermal barrier coating. For instance, incorporating ratio of gadolinia particle with the gadolinia suspension is almost 100%. To the contrast, plasma spray coating provides only about 20% of gadolinia incorporation ratio from powder to gadolinia incorporated in thermal barrier coating.

Method of Preparation

The present invention provides a method to produce a CMAS resistant thermal barrier coating.

In one embodiment, the method comprises steps of:
a) applying an thermal barrier coating layer on a substrate;
b) preparing a reactive gadolinia suspension; and
c) treating the thermal barrier coating layer with the reactive gadolinia suspension,
wherein the thermal barrier coating layer comprises a microstructure; and
wherein a reactive gadolinia is embedded in the microstructure, or deposited on the surface of the microstructure, or deposited on the surface of the thermal barrier coating. In certain embodiments, the thermal barrier coating can be a ceramic coating layer comprising hafnia or fully or partially stabilized zirconia. In particular embodiments, the stabilized zirconia can include, without limitation, yttria-stabilized-zirconia (YSZ), magnesia-stabilized-zirconia, calcia-stabilized-zirconia, ceria-stabilized-zirconia, or a combination thereof.

In certain another embodiments, the thermal barrier coating layer is applied by plasma or combustion thermal spraying, suspension plasma spraying, or electron beam physical vapor deposition (EBPVD).

In certain embodiments, the microstructure in the thermal barrier coating comprises a ceramic matrix with at least one of cracks, pores, and inter-particle boundaries. Such microstructures in the thermal barrier coating may be introduced as part of the standard thermal barrier coating procedure or intentionally by the process of coating application.

In certain embodiments, the reactive gadolinia suspension is prepared by combining reactive gadolinia with the suspension solvent. In certain embodiments, the suspension solvent has a viscosity of lower than 100 centipoise, lower than 50 centipoise, or lower than 20 centipoise. In particular embodiments, the suspension solvent is, but is not limited to, water, acetic acid, benzene, tetrachloromethane, pentane, ethyl ether, methyl t-butyl ether, hexane, acetone, triethylamine, acetonitrile, heptane, methyl ethyl ketone, cyclopentane, dichloromethane, n-butyl chloride, ethyl acetate, glyme, iso-octane, methyl n-propyl ketone, tetrahydrofuran, chloroform, methyl isobutyl ketone, methanol, toluene, 1,1,2-trichlorotrifluoroethane, n-butyl acetate, ethylene dichloride, chlorobenzene, methyl isoamyl ketone, xylene, n,n-dimethylformamide, trifluoroacetic acid, pyridine, cyclohexane, ethyl alcohol, o-dichlorobenzene, 1,4-dioxane, n-methylpyrrolidone, 2-methoxyethanol, dimethyl acetamide, dimethyl formamide, dimethyl sulfoxide, n-propyl alcohol, isopropyl alcohol, n-butyl alcohol, isobutyl alcohol, isopropyl myristate, petroleum ether, propylene carbonate, 1,2,4-trichlorobenzene, or a mixture thereof.

In certain embodiments, the reactive gadolinia is in the form of one or more nanoparticles. In other certain embodiments, the size of the gadolinia nanoparticles is not particularly limited, but may be between about 1 nm and 500 nm, between about 5 nm and 300 nm or between about 10 nm and 200 nm in diameter.

In certain embodiments, the reactive gadolinia suspension may contain between about 1% and 90% by weight of the reactive gadolinia nanoparticles, between about 5% and 80% by weight of the reactive gadolinia nanoparticles, between about 10% and 50% by weight of the reactive gadolinia nanoparticles, or between about 10% and 25% by weight of the reactive gadolinia nanoparticles based on the weight of the suspension.

The method of infiltrating can include dipping, painting, spraying, or pressure infiltrating with the reactive gadolinia suspension. It is also contemplated that the method can further include evaporating the suspension solvent.

In other certain embodiments, the method further comprises repeating the step of treating the thermal barrier coating layer to achieve the desired content of gadolinia. In particular embodiments, the treating step is performed two, three, five, or ten times to achieve the desired content of gadolinia.

In another embodiments, the CMAS resistant thermal barrier coating produced by the method can be, without limitation, between about 1 mil and 250 mil, between about 3 mil and 100 mil, or between about 5 mil and 25 mil in thickness.

The disclosed methods can be advantageous to provide a CMAS resistant thermal barrier coating produced by a single treatment process. This eliminates further application of CMAS-protective layers and reduces processing time and cost.

Articles

In addition, this invention provides an article coated with a CMAS resistant thermal barrier coating layer, which comprises a reactive gadolinia. The thermal barrier coating includes microstructures comprising a ceramic matrix with at least one of cracks, pores, and inter-particle boundaries.

The reactive gadolinia is embedded in the microstructure, or deposited on the surface of the microstructure, or deposited on the surface of the thermal barrier coating to protect the coating from the CMAS contaminant. The article coated with a CMAS resistant thermal barrier coating is particularly improved with respect to CMAS resistance.

In one embodiment, the article may comprise;
 a) a substrate;
 b) a thermal barrier coating layer; and
 c) a reactive gadolinia;
wherein the thermal barrier coating layer comprises a microstructure; and
wherein the reactive gadolinia is embedded in the microstructure, or deposited on the surface of the microstructure, or deposited on the surface of the thermal barrier coating.

In certain embodiments, the article with the CMAS resistant thermal barrier coating operates at highly elevated temperature. Such article is, but not limited to, a turbine fuel nozzle, fuel nozzle guide, combustion chamber liner, transition duct, blade, vane or blade outer air seal.

In other embodiments, the thermal barrier coating comprises a ceramic coating layer comprising hafnia or fully or partially stabilized zirconia. In particular embodiments, the stabilized zirconia can include, without limitation, yttria-stabilized-zirconia (YSZ), magnesia-stabilized-zirconia, calcia-stabilized-zirconia, ceria-stabilized-zirconia, or a combination thereof.

In certain embodiments, the microstructure in the thermal barrier coating comprises a ceramic matrix with at least one of cracks, pores, and inter-particle boundaries. Such microstructures may be introduced as part of the standard thermal barrier coating procedure or intentionally by the process of coating application.

In other embodiments, the reactive gadolinia in the article is in the form of one or more nanoparticles, of which the size of the gadolinia nanoparticles is not particularly limited, but may be between about 1 nm and 500 nm, between about 5 nm and 300 nm or between about 10 nm and 200 nm in diameter.

In certain other embodiments, the article which is treated according to the methods of the invention to produce the thermal barrier coating layer are further coated with an additional layer of material to provide an additional property.

Other multilayered or segmented coating layers may be applied on the CMAS resistant thermal barrier coating of the present invention for other protective reasons. Likewise, the CMAS resistant thermal barrier coating of the present invention may be applied on the other coating layers for other technical improvements.

EXAMPLE

FIG. 2 shows an exemplary diagram of steps for producing a CMAS resistant thermal barrier coating.

A thermal barrier coating layer is applied on a blade outer air seal by electron beam physical vapor deposition (EBPVD) under standard conditions. The thermal barrier coating is composed of a ceramic coating matrix comprising yttria-stabilized-zirconia (YSZ). The normal thickness of this thermal barrier coating is about 20 mil.

A slurry gadolinia nanoparticle is prepared by mixing the gadolinia nanoparticles with a 50:50 mixture by volume of water and ethanol. The slurry suspension solution contains about 25% by weight of reactive gadolinia nanoparticles based on the total weight of the suspension solution. The size of the gadolinia nanoparticles in the slurry suspension is about 10-100 nm in diameter (US Research Nanomaterials, Inc., Houston, Tex., USA).

After optionally cleaning the surface of the thermal barrier coating layer, the slurry gadolinia nanoparticle suspension is applied on the surface of the thermal barrier coating layer by paint brush. Meanwhile, the elevated pressure, e.g. 10 MPa, is applied after painting with the slurry suspension for pressure infiltrating. Once the slurry suspension infiltrates the thermal barrier coating layer, the suspension solvent evaporates at room temperature. After the solvent evaporates, the same cycle of treatment with the slurry gadolinia nanoparticle suspension is repeated for about 10 times, until gadolinia nanoparticles incorporates in the thermal barrier coating at least 50% of top portion from the surface.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A method for preparing a calcium-magnesium aluminosilicate (CMAS) resistant thermal barrier coating comprising steps of:
 a) applying a thermal barrier coating layer on a substrate;
 b) preparing a reactive gadolinia sol; and
 c) treating the thermal barrier coating layer with the reactive gadolinia sol, wherein the method of treating is pressure infiltrating;
wherein the thermal barrier coating layer comprises a microstructure; and
wherein reactive gadolinia is embedded in the microstructure.

2. The method of claim 1, wherein the thermal barrier coating layer is a ceramic coating layer comprising hafnia or fully or partially stabilized zirconia.

3. The method of claim 1, wherein the thermal barrier coating layer is applied by plasma or combustion thermal spraying, suspension plasma spraying, or electron beam physical vapor deposition (EBPVD).

4. The method of claim 1, wherein the microstructure comprises a ceramic matrix with at least one of cracks, pores, and inter-particle boundaries.

5. The method of claim 1, wherein the reactive gadolinia sol comprises reactive gadolinia nanoparticles.

6. The method of claim 1, the reactive gadolinia sol is prepared by combining reactive gadolinia nanoparticles with a suspension solvent.

7. The method according to claim 6, wherein the suspension solvent is water, acetic acid, benzene, tetrachloromethane, pentane, ethyl ether, methyl t-butyl ether, hexane, acetone, triethylamine, acetonitrile, heptane, methyl ethyl ketone, cyclopentane, dichloromethane, n-butyl chloride, ethyl acetate, glyme, iso-octane, methyl n-propyl ketone, tetrahydrofuran, chloroform, methyl isobutyl ketone, methanol, toluene, 1,1,2-trichlorotrifluoroethane, n-butyl acetate, ethylene dichloride, chlorobenzene, methyl isoamyl ketone, xylene, n,n-dimethylformamide, trifluoroacetic acid, pyridine, cyclohexane, ethyl alcohol, o-dichlorobenzene, 1,4-dioxane, n-methylpyrrolidone, 2-methoxyethanol, dimethyl acetamide, dimethyl formamide, dimethyl sulfoxide, n-propyl alcohol, isopropyl alcohol, n-butyl alcohol, isobutyl alcohol, isopropyl myristate, petroleum ether, propylene carbonate, 1,2,4-trichlorobenzene, or a mixture thereof.

8. The method of claim 1, wherein the method further comprises the step of removing the suspension solvent from the treated substrate.

* * * * *